US011631627B2

(12) United States Patent
Choi (10) Patent No.: US 11,631,627 B2
(45) Date of Patent: Apr. 18, 2023

(54) METHOD OF MANUFACTURING SEMICONDUCTOR HAVING DOUBLE-SIDED SUBSTRATE

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 98 days.

(21) Appl. No.: 17/237,046

(22) Filed: Apr. 22, 2021

(65) Prior Publication Data

US 2021/0335691 A1    Oct. 28, 2021

(30) Foreign Application Priority Data

Apr. 23, 2020  (KR) .......................... 10-2020-0049561

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4882* (2013.01); *H01L 21/565* (2013.01); *H01L 23/3107* (2013.01); *H01L 23/3735* (2013.01); *H01L 24/29* (2013.01); *H01L 24/83* (2013.01); *H01L 25/072* (2013.01); *H01L 25/50* (2013.01); *B23K 35/0233* (2013.01); *B23K 35/302* (2013.01); *B23K 35/3006* (2013.01); *B23K 2101/40* (2018.08); *H01L 2224/29211* (2013.01); *H01L 2224/29216* (2013.01); *H01L 2224/29239* (2013.01);
(Continued)

(58) Field of Classification Search
CPC .. H01L 21/4882; H01L 23/3675; H01L 25/50
See application file for complete search history.

(56) References Cited

U.S. PATENT DOCUMENTS 9,402,321 B2 * 7/2016 Shimamura ........ B23K 35/0244
2012/0281725 A1 * 11/2012 Huff .................... H01S 5/02355
257/E33.056

(Continued)

FOREIGN PATENT DOCUMENTS

KR    10-2001-0111736 A    12/2001
KR       10-0867573 B1     11/2008

*Primary Examiner* — Dale E Page
*Assistant Examiner* — Wilner Jean Baptiste
(74) *Attorney, Agent, or Firm* — Park, Kim & Suh, LLC (57) ABSTRACT

Provided is a method of manufacturing a semiconductor having a double-sided substrate including preparing a first substrate on which a specific pattern is formed to enable electrical connection, preparing at least one semiconductor chip bonded to a metal post, bonding the at least one semiconductor chip to the first substrate, bonding a second substrate to the metal post, forming a package housing by packaging the first substrate and the second substrate to expose a lead frame, and forming terminal leads toward the outside of the package housing. Accordingly, the semiconductor chip and the metal post are previously joined to each other and are respectively bonded to the first substrate and the second substrate so that damage generated while bonding the semiconductor chip may be minimized and electrical properties and reliability of the semiconductor chip may be improved.

21 Claims, 8 Drawing Sheets

(51) Int. Cl.
  H01L 25/07 (2006.01)
  H01L 23/00 (2006.01)
  H01L 23/373 (2006.01)
  H01L 23/31 (2006.01)
  H01L 21/56 (2006.01)
  H01L 25/00 (2006.01)
  B23K 35/02 (2006.01)
  B23K 35/30 (2006.01)
  B23K 101/40 (2006.01)

(52) U.S. Cl.
  CPC ........... *H01L 2224/29247* (2013.01); *H01L 2224/83224* (2013.01); *H01L 2224/83801* (2013.01); *H01L 2924/014* (2013.01); *H01L 2924/0105* (2013.01); *H01L 2924/01029* (2013.01); *H01L 2924/01047* (2013.01); *H01L 2924/01082* (2013.01); *H01L 2924/13034* (2013.01); *H01L 2924/13055* (2013.01); *H01L 2924/13091* (2013.01); *H01L 2924/1427* (2013.01); *H01L 2924/14252* (2013.01); *H01L 2924/15787* (2013.01)

(56) References Cited

U.S. PATENT DOCUMENTS

2017/0326640 A1* 11/2017 Schmitt .................... B22F 1/05
2018/0240731 A1*  8/2018 Choi .................. H01L 23/3735

\* cited by examiner

METHOD OF MANUFACTURING SEMICONDUCTOR HAVING DOUBLE-SIDED SUBSTRATE

CROSS-REFERENCE TO RELATED PATENT APPLICATION

This application claims the benefit of Korean Patent Application No. 10-2020-0049561, filed on Apr. 23, 2020, in the Korean Intellectual Property Office, the disclosure of which is incorporated herein in its entirety by reference.

BACKGROUND OF THE INVENTION

1. Field of the Invention

The present invention relates to a method of manufacturing a semiconductor having a double-sided substrate in which a semiconductor chip and a metal post are previously joined to each other and are respectively bonded to an upper substrate and a lower substrate so that damage occurring due to a difference in thermal expansion coefficient generated while bonding the semiconductor chip may be minimized so as to lower defect rate and electrical properties and reliability of the semiconductor chip may be improved.

2. Description of the Related Art

Figure 1:
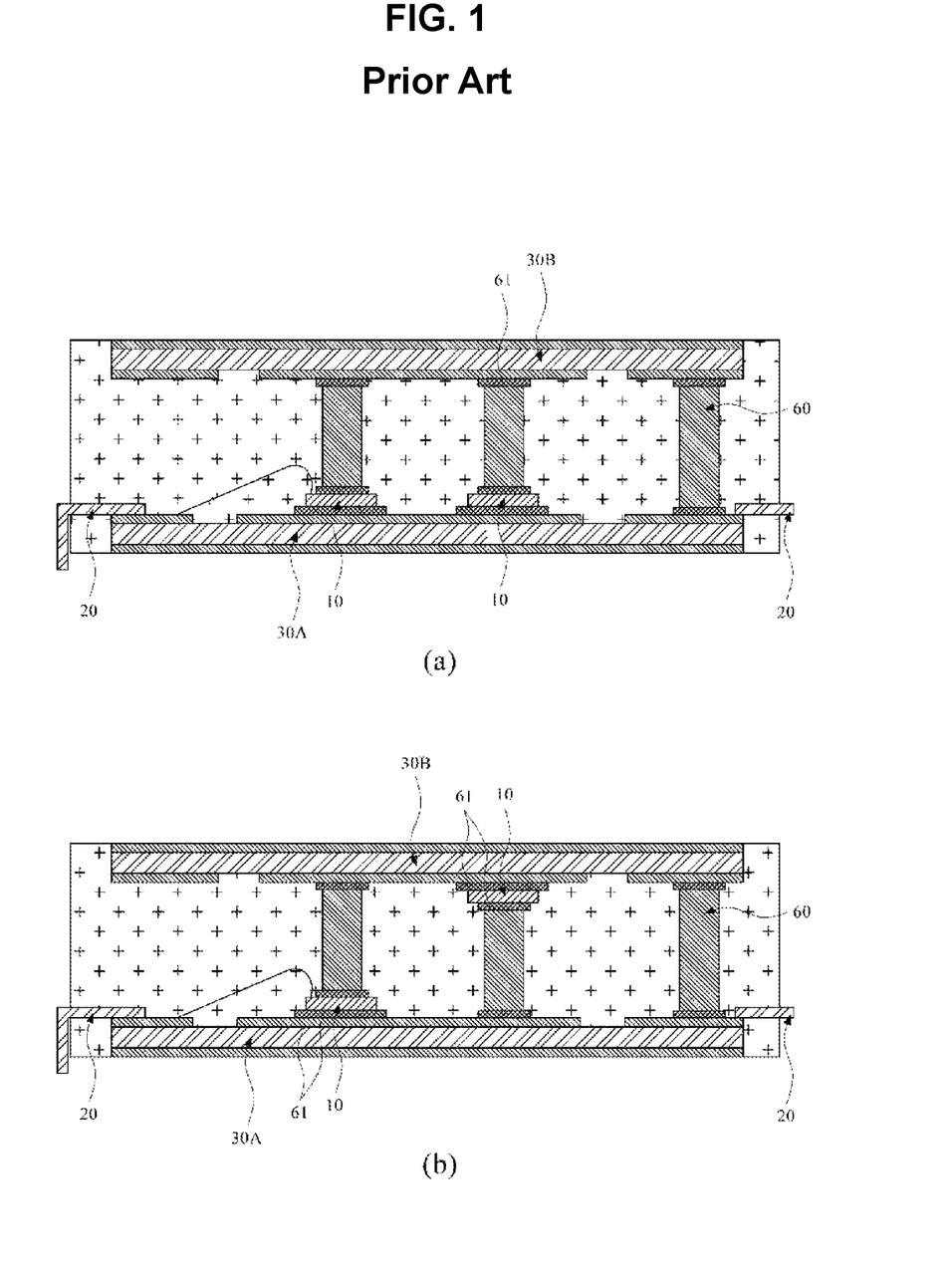
FIG. 1 illustrates a conventional method of manufacturing a semiconductor having a double-sided substrate.

In general, as illustrated in FIG. 1(a), a conventional semiconductor package having a double-sided substrate may include at least one semiconductor chip 10 bonded on pads of lead frames 20 or bonded between a lower metal insulating substrate 30A including a metal pattern layer and metal posts 60 using adhesives 61 interposed therebetween, wherein the semiconductor chips 10 are bonded on the lower metal insulating substrate 30A, the metal posts 60 are bonded on the semiconductor chips 10, and then, an upper metal insulating substrate 30B is bonded to the metal posts 60. Accordingly, the semiconductor chips 10 are bonded only to one side of the substrate.

Also, as illustrated in FIG. 1(b), the semiconductor chip 10 is bonded on the lower metal insulating substrate 30A, the metal posts 60 are bonded to the upper metal insulating substrate 30B, the lower surface of the metal post 60 bonded to the upper metal insulating substrate 30B is bonded to the upper surface of the semiconductor chip 10 bonded to the lower metal insulating substrate 30A using the adhesive 61 interposed therebetween, the semiconductor chip 10 is bonded to the upper metal insulating substrate 30B, the metal post 60 is bonded to the lower metal insulating substrate 30A, and then, the upper surface of the metal post 60 bonded to the lower metal insulating substrate 30A is bonded to the lower surface of the semiconductor chip 10 bonded to the upper metal insulating substrate 30B using the adhesive 61 interposed therebetween. Accordingly, the semiconductor chips 10 are alternately bonded to both sides of the substrate.

When the method of manufacturing a semiconductor described above is used, damage on the upper surface of the semiconductor chip is generated due to a difference in thermal expansion coefficient while bonding the semiconductor chip, the metal post, or the substrate using soldering or sintering so that defect rate increases and electrical properties and reliability of the semiconductor chip are lowered.

Also, the difficulty level of the process increases due to separate bonding of the semiconductor chip and a large quantity of bonding works is not available.

SUMMARY OF THE INVENTION

The present invention provides a method of manufacturing a semiconductor having a double-sided substrate in which a semiconductor chip and a metal post are previously joined to each other and are respectively bonded to an upper substrate and a lower substrate so that damage occurring due to a difference in thermal expansion coefficient generated while bonding the semiconductor chip may be minimized so as to lower defect rate, and electrical properties and reliability of the semiconductor chip may be improved, compared with separate bonding of the substrate, the semiconductor chip, and the metal post.

According to an aspect of the present invention, there is provided a method of manufacturing a semiconductor having a double-sided substrate including: preparing a first substrate on which a specific pattern is formed to enable electrical connection; preparing at least one semiconductor chip bonded to one side of a metal post; bonding the at least one semiconductor chip to the first substrate; bonding a second substrate to the other side of the metal post; forming a package housing by packaging the first substrate and the second substrate; and forming terminal leads toward the outside of the package housing to enable electrical connection.

According to another aspect of the present invention, there is provided method of manufacturing a semiconductor having a double-sided substrate including: preparing a first substrate comprising a specific pattern formed thereon to enable electrical connection and a second substrate; preparing at least one semiconductor chip bonded to one side of a metal post; bonding the at least one semiconductor chip to each of the first substrate and the second substrate; alternately bonding the second substrate to the other side of the metal post of the first substrate, and the first substrate to the other side of the metal post of the second substrate; forming a package housing by packaging the first substrate and the second substrate; and forming terminal leads toward the outside of the package housing to enable electrical connection.

The method may further include additionally and electrically connecting the at least one semiconductor chip to the first substrate, the second substrate, or the terminal leads by wire bonding or flip chip bonding.

The first substrate or the second substrate may include an insulating layer and at least one conductive layer stacked on an upper part, a lower part, or both upper part and lower part of the insulating layer.

The first substrate or the second substrate may be formed of a conductive layer.

The metal post may include a single conductive material or at least two conductive materials.

The conductive materials of the metal post may include at least any one of Cu, Mo, Mn, Al, Si, and C.

The metal post and the semiconductor chip may be bonded to each other by a soldering process using a solder containing Sn or Pb.

The soldering process may be performed within 15 seconds.

Materials included in the solder may be different from those of an alloy in an adhesive used to bond the semiconductor chip to the first substrate or the second substrate.

The metal post and the semiconductor chip may be bonded to each other by a sintering process using an adhesive containing 60% or more of Cu or an adhesive containing 60% or more of Ag.

Here, the adhesive may be provided as in a paste form or a film form.

The metal post and the semiconductor chip may be bonded to each other by using a laser.

The metal post and the semiconductor chip may be bonded to each other by directly contacting a heat block to the metal post or the semiconductor chip.

The metal post and the semiconductor chip may be bonded to each other by using hot air which does not directly contact the metal post or the semiconductor chip.

Here, the hot air may have the temperature in the range of 50° C. through 450° C. and may contain a predetermined percentage of nitrogen or hydrogen.

The first substrate or the second substrate may be partly or entirely exposed to the outside of the upper part or the lower part of the package housing.

The terminal leads may be joined and electrically connected to the first substrate or the second substrate disposed inside the package housing.

Here, the terminal leads may be joined to the first substrate or the second substrate by ultrasonic welding.

A surface pad metal of the semiconductor chip may include 80% or more of Al, Ag, or Au.

The semiconductor chip may be used in electric vehicles, hydrogen electric vehicles, inverters, or converters.

The semiconductor chip may include an insulated gate bipolar transistor (IGBT) or a metal-oxide semiconductor field effect transistor (MOSFET).

A heat sink may be bonded to the first substrate or the second substrate exposed to the outside of the upper part or the lower part of the package housing.

The heat sink may be spaced apart from the package housing, installed inside the package housing, and bonded to the first substrate or the second substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

A method of manufacturing a semiconductor having a double-sided substrate according to an embodiment of the present invention includes preparing a first substrate 110 on which a specific pattern 112 is formed to enable electrical connection, preparing at least one semiconductor chip 130 bonded to a metal post 120, bonding the at least one semiconductor chip 130 to the first substrate 110, bonding a second substrate 140 to the metal post 120, forming a package housing 150 by packaging the first substrate 110 and the second substrate 140 to expose a lead frame 111, and forming terminal leads 111a toward the outside of the package housing 150. Accordingly, the semiconductor chips 130 and the metal posts 120 are previously bonded and then, are respectively bonded to the first substrate 110 and the second substrate 140 so that damage generated while bonding the semiconductor chips 130 may be minimized, and electrical properties and reliability of the semiconductor chips 130 may be improved.

Hereinafter, the method of manufacturing a semiconductor having a double-sided substrate according to an embodiment of the present invention will be described in more detail with reference to FIGS. 2 through 4.

Figure 2:
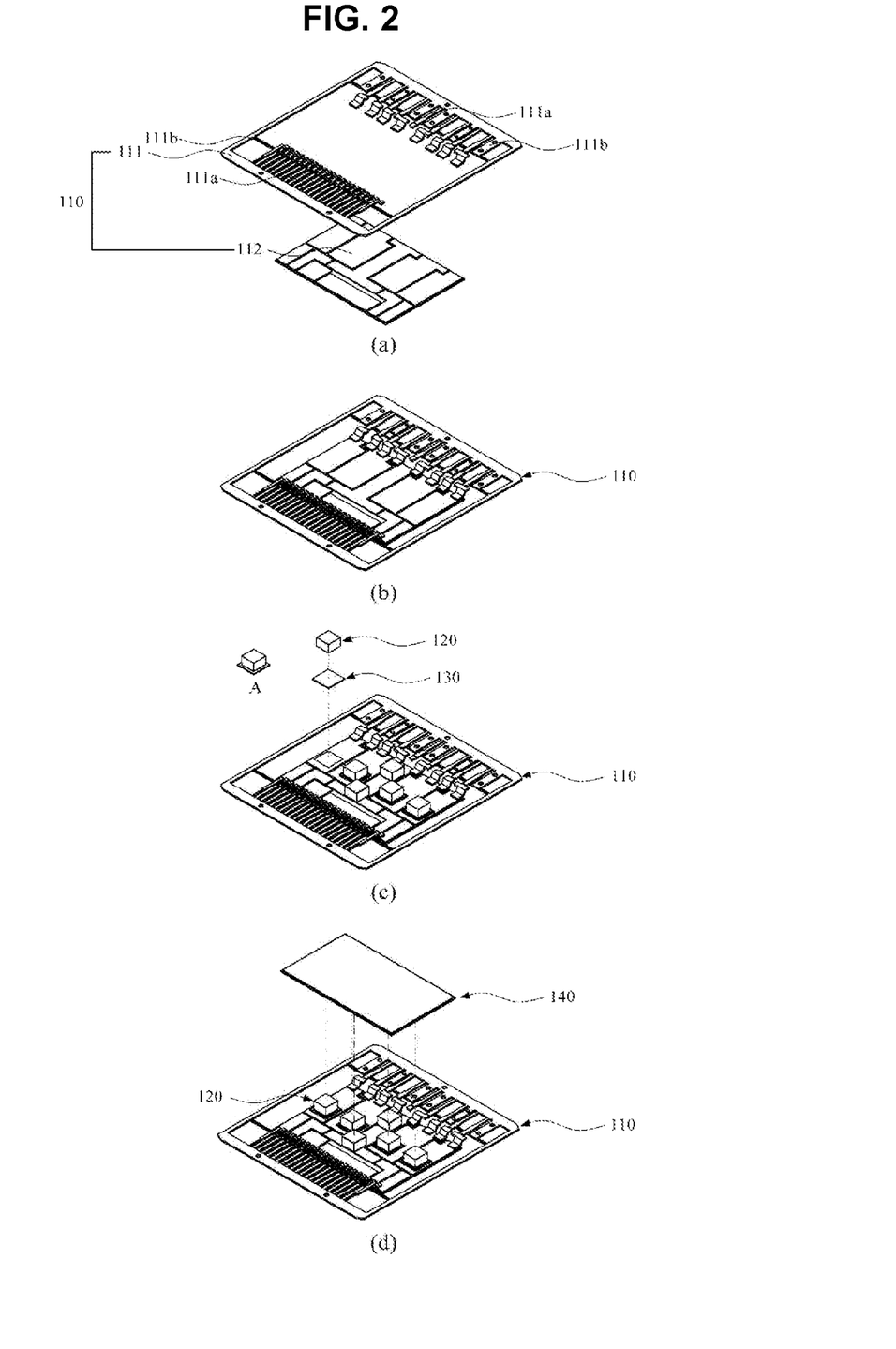
FIGS. 2 and 3 are flowcharts illustrating a method of manufacturing a semiconductor having a double-sided substrate according to an embodiment of the present invention.

First, as illustrated in FIGS. 2(a) and 2(b), the first substrate 110, on which the specific pattern 112 is divided and formed to enable electrical connection with the lead frame 111 or the semiconductor chips 130, is prepared.

Figure 4:
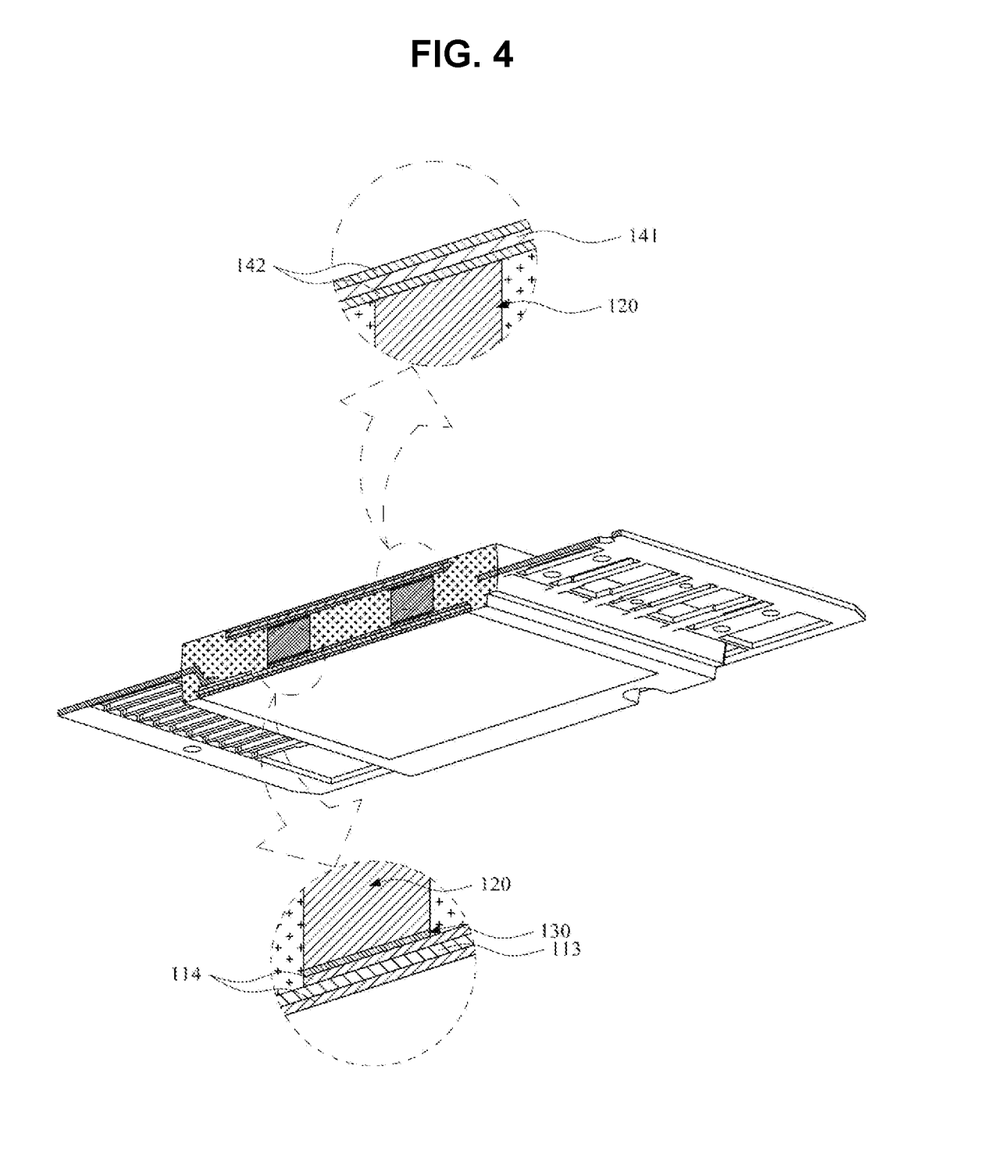
FIG. 4 is a cross-sectional view of a semiconductor manufactured using a method of manufacturing a semiconductor having a double-sided substrate according to an embodiment of the present invention.

Here, as illustrated in an enlarged view of FIG. 4, the first substrate 110 may include at least one conductive layer 114 stacked on an upper part, a lower part, or both upper part and lower part of an insulating layer 113 formed of Al2O3 or AlN, or may include the conductive layer 114 as a single structure.

Then, as illustrated in FIG. 2(c), the at least one semiconductor chip 130 bonded to one side of the metal post 120 is prepared. That is, the metal post 120 and the semiconductor chip 130 are bonded to each other to form a unit block A. In the following process, the metal post 120 and the semiconductor chip 130 are not separately bonded and instead, the unit block A is each bonded to the first substrate 110 or the second substrate 140.

Also, the at least one semiconductor chip 130 may be additionally and electrically connected to the first substrate 110, the second substrate 140, or the terminal leads 111a of the lead frame 111 by wire bonding or flip chip bonding. More specifically, a source area or a drain area of the semiconductor chip 130 is bonded to one side of the metal post 120 and if needed, a gate terminal of the semiconductor chip 130 may be electrically connected to the first substrate 110, the second substrate 140, or the terminal leads 111a of the lead frame 111 by wire bonding or flip chip bonding.

The metal post 120 may include a single conductive material or at least two conductive materials.

For example, the conductive materials of the metal post 120 may include at least any one of Cu, Mo, Mn, Al, Si, and C.

A surface pad metal of the semiconductor chip 130 may include 80% or more of Al, Ag, or Au.

Also, a silicon control rectifier (SCR), a power transistor, an insulated gate bipolar transistor (IGBT), a metal-oxide semiconductor field effect transistor (MOSFET), a power rectifier, a power regulator, or a power semiconductor including a combination thereof may be applied as the semiconductor chip 130 and may be used in electric vehicles, hydrogen electric vehicles, inverters, or converters.

The metal post 120 and the semiconductor chip 130 are bonded to each other by a soldering process using a solder containing Sn or Pb, wherein the soldering process is performed within 15 seconds and thus, damage on the surface of the semiconductor chip 130 occurring due to a difference in thermal expansion coefficient between the metal post 120 and the semiconductor chip 130 may be minimized.

Here, materials included in the solder may be different from those of an alloy in an adhesive used to bond the semiconductor chip 130 to the first substrate 110 or the second substrate 140.

The metal post 120 and the semiconductor chip 130 are bonded to each other by a sintering process using an adhesive containing 60% or more of Cu or an adhesive containing 60% or more of Ag, wherein the adhesive may be provided as in a paste form or a film form.

The metal post 120 and the semiconductor chip 130 may be bonded to each other by using a laser and thus, may be easily joined so as to enable a large quantity of bonding works.

The metal post 120 and the semiconductor chip 130 may be bonded to each other by directly contacting a heat block (not illustrated) to the metal post 120 or the semiconductor chip 130.

The metal post 120 and the semiconductor chip 130 may be bonded to each other by hot air and thereby, bonding without direct contacting may be available. Here, the hot air may have the temperature in the range of 50° C. through 450° C. and may contain a predetermined percentage of nitrogen or hydrogen.

Then, as illustrated in FIG. 2(c), the at least one semiconductor chip 130 is bonded to the first substrate 110.

Figure 3:
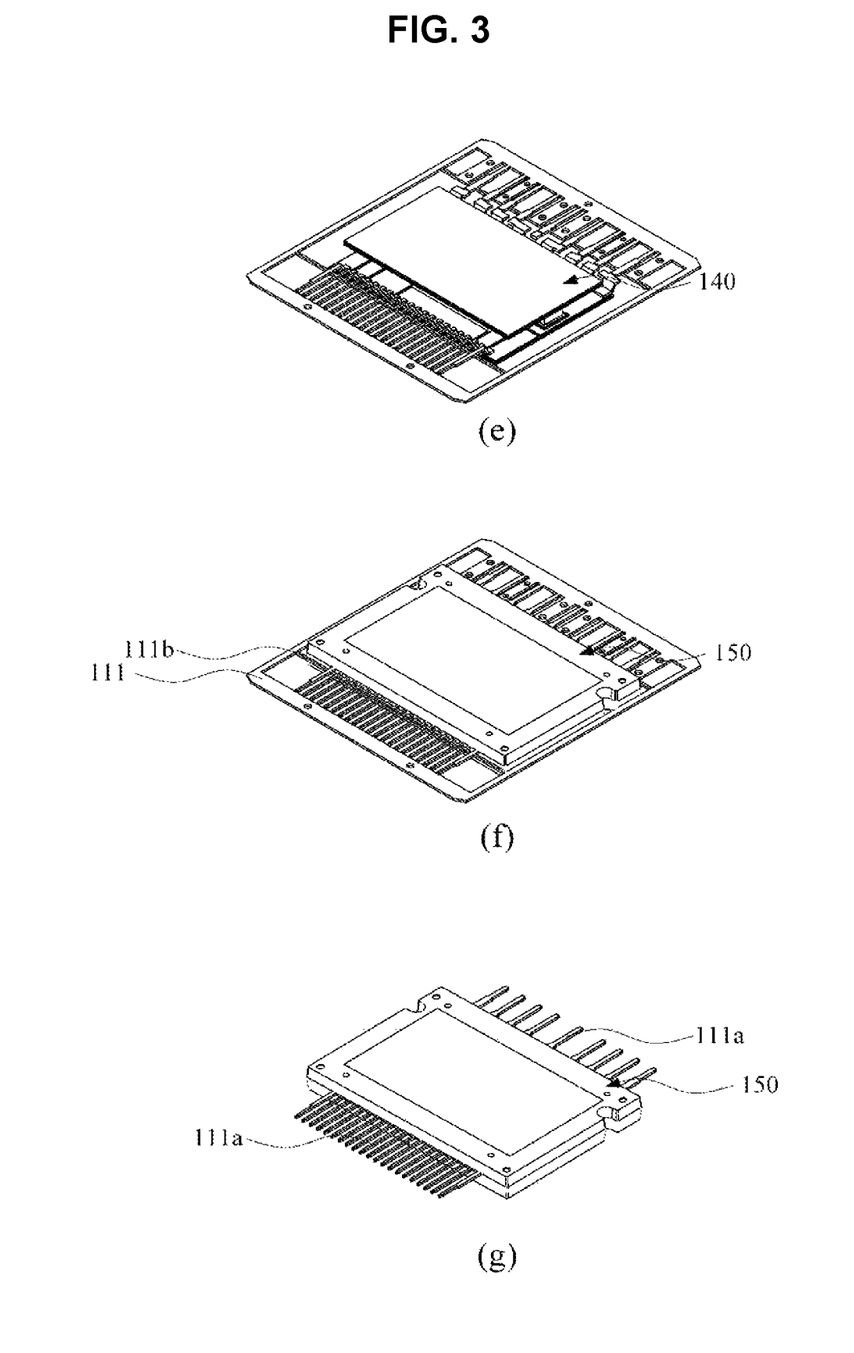

Then, as illustrated in FIGS. 2(d) and 3(e), the second substrate 140 is bonded to the other side of the metal post 120.

Here, as illustrated in an enlarged view of FIG. 4, the second substrate 140 may include at least one conductive layer 142 stacked on an upper part, a lower part, or both upper part and lower part of an insulating layer 141 formed of Al2O3 or AlN, or may include the conductive layer 142 as a single structure.

The process of bonding the at least one semiconductor chip 30 to the first substrate 110 may be performed using soldering or sintering. For example, the soldering may be performed using a solder containing Sn or Pb at the temperature in the range of 150° C. through 450° C. for predetermined time. Also, the sintering is performed using an adhesive containing 60% or more of Cu or an adhesive containing 60% or more of Ag, wherein the adhesive may be provided as in a paste form or a film form.

In addition, the process of bonding the second substrate 140 to the other side of the metal post 120 may be performed using soldering or sintering. For example, the soldering may be performed using a solder containing Sn or Pb at the temperature of 150° C. through 450° C. for predetermined time. Also, the sintering may be performed using an adhesive containing 60% or more of Cu or an adhesive containing 60% or more of Ag, wherein the adhesive may be provided as in a paste form or a film form.

Here, the process of bonding the at least one semiconductor chip 30 to the first substrate 110 and the process of bonding the second substrate 140 to the other side of the metal post 120 may be sequentially performed or may be performed at the same time.

More specifically, the at least one semiconductor chip 30 is fixed to the first substrate 110 after performing the process of bonding the at least one semiconductor chip 30 to the first substrate 110. Then, the process of bonding the second substrate 140 to the other side of the metal post 120 may be performed or one bonding process (soldering or sintering) may be performed after the at least one semiconductor chip 30 is placed on the first substrate 110 and the second substrate 140 is placed on the other side of the metal post 120.

Then, as illustrated in FIG. 3(f), the first substrate 110 and the second substrate 140 are packaged using an Epoxy Molding Compound (EMC), PolyPhenylene Sulfide (PPS), or PolyButylene Terephtalate (PBT) to form the package housing 150 and the lead frame 111 is exposed.

Here, the first substrate 110 or the second substrate 140 may be partly or entirely exposed to the outside of the upper part or the lower part of the package housing 150.

Also, the terminal leads 111a are joined and electrically connected to the first substrate 110 or the second substrate 140 disposed inside the package housing 150 and may be bonded to the first substrate 110 or the second substrate 140 by ultrasonic welding.

Finally, as illustrated in FIG. 3(g), dummies 111b of the lead frame 111 exposed to the outside of the package housing 150 are removed to form the terminal leads 111a.

Figure 8:
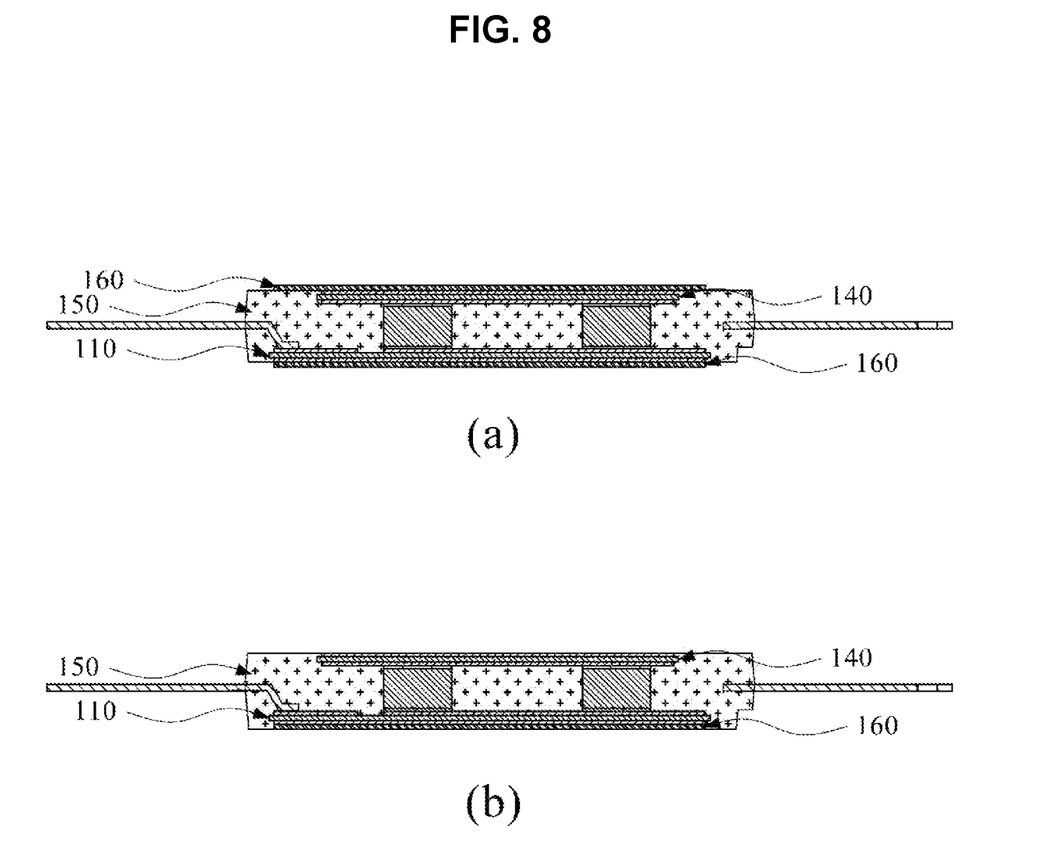
FIG. 8 illustrates a structure of a heat sink in a semiconductor manufactured according to the embodiments of the present invention.

As illustrated in FIG. 8(a), a heat sink 160 may be bonded to the first substrate 110 or the second substrate 140 both exposed to the outside of the upper part or the lower part of the package housing 150.

Also, as illustrated in FIG. 8(b), the heat sink 160 may be spaced apart from the package housing 150, installed inside the package housing 150, and bonded to the first substrate 110 or the second substrate 140.

For example, the heat sink 160 may be formed of a conductive substrate including 50% or more of metal components having excellent thermal conductivity, a conductive or non-conductive tape, or paste hardened and solidified at a high temperature of above 100° C. Then, the heat sink 160 is bonded to the first substrate 110 or the second substrate 140 and thereby, radiates heat from the semiconductor chips 130.

A method of manufacturing a semiconductor having a double-sided substrate according to another embodiment of the present invention includes preparing the first substrate 110 including the specific pattern 112 formed thereon to enable electrical connection and the second substrate 140, preparing the at least one semiconductor chip 130 bonded to the metal post 120, bonding the at least one semiconductor chip 130 to the first substrate 110 and the second substrate 140, bonding the second substrate 140 to the metal post 120 of the first substrate 110, bonding the first substrate 110 to the metal post 120 of the second substrate 140, forming the package housing 150 by packaging the first substrate 110 and the second substrate 140 to expose the lead frame 111, and forming the terminal leads 111a toward the outside of the package housing 150. Accordingly, the semiconductor chips 130 and the metal posts 120 are previously bonded, then, the semiconductor chips 130 are respectively bonded to the first substrate 110 or the second substrate 140, and the metal posts 120 are each bonded to the second substrate 140 or the first substrate 110 so that damage generated while bonding the semiconductor chips 130 may be minimized, and electrical properties and reliability of the semiconductor chips 130 may be improved.

Hereinafter, the method of manufacturing a semiconductor having a double-sided substrate according to another embodiment of the present invention will be described in more detail with reference to FIGS. 5 through 7.

Figure 5:
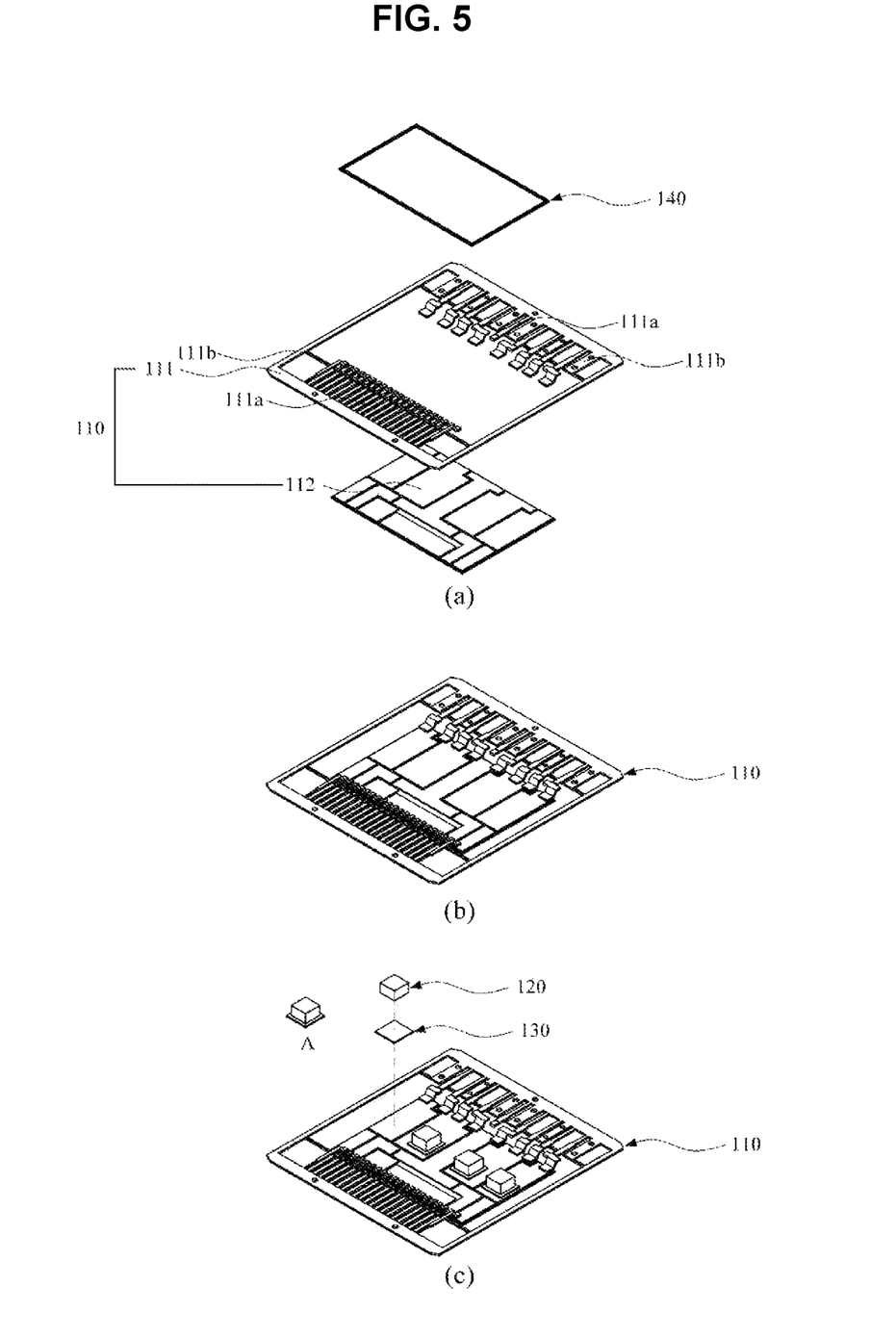
FIGS. 5 and 6 are flowcharts illustrating a method of manufacturing a semiconductor having a double-sided substrate according to another embodiment of the present invention.

Firstly, as illustrated in FIGS. 5(*a*) and 5(*b*), the first substrate 110, on which the specific pattern 112 is divided and formed to enable electrical connection with the lead frame 111 or the semiconductor chips 130, and the second substrate 140 are each prepared.

Figure 7:
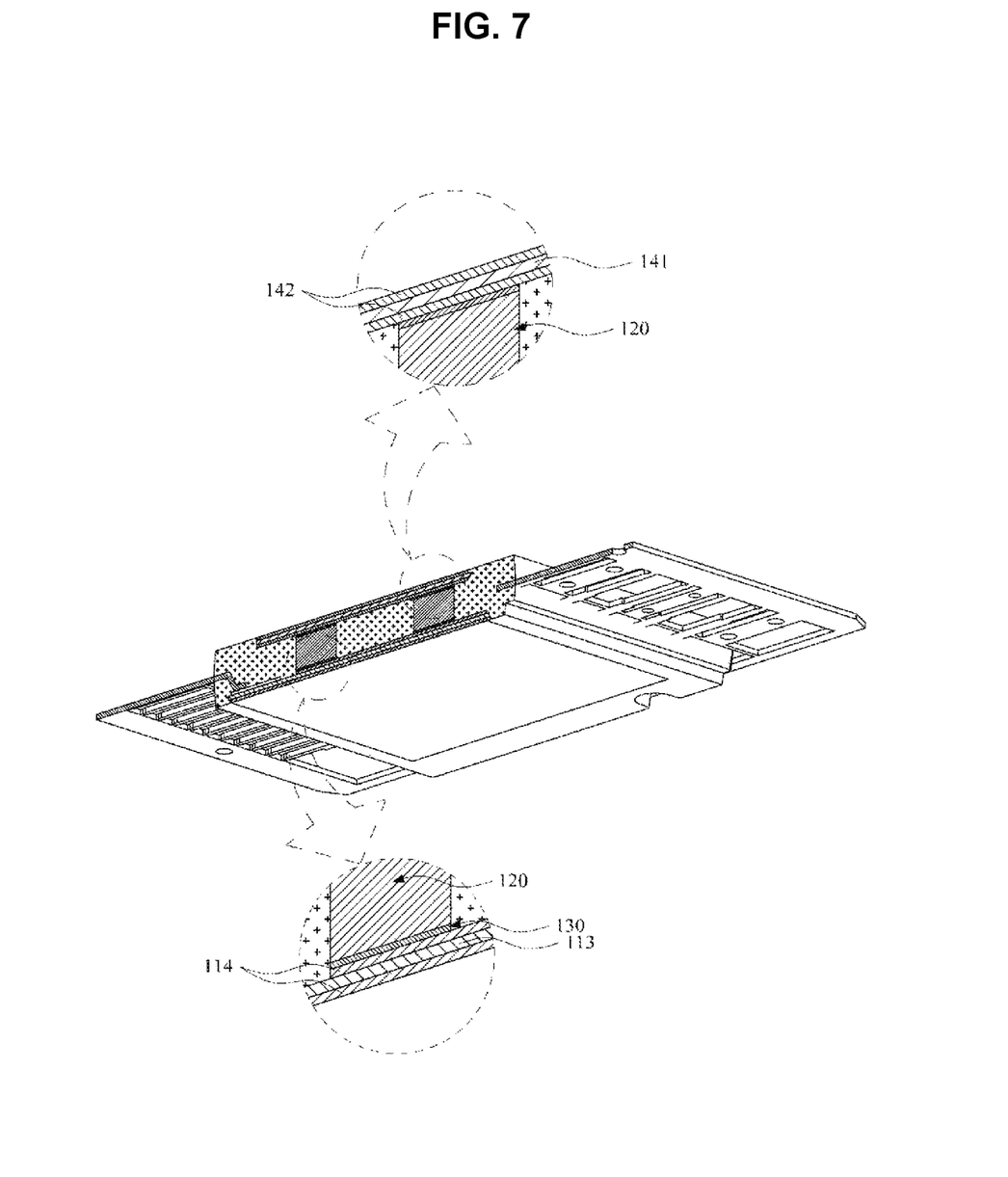
FIG. 7 is a cross-sectional view of a semiconductor manufactured using a method of manufacturing a semiconductor having a double-sided substrate according to another embodiment of the present invention.

Here, as illustrated in an enlarged view of FIG. 7, the first substrate 110 may include the at least one conductive layer 114 stacked on an upper part, a lower part, or both upper part and lower part of the insulating layer 113 formed of Al2O3 or AlN, or may include the conductive layer 114 as a single structure.

Then, as illustrated in FIG. 5(*c*), the at least one semiconductor chip 130 bonded to one side of the metal post 120 is prepared. That is, the metal post 120 and the semiconductor chip 130 are bonded to each other to form the unit block A. In the following process, the metal post 120 and the semiconductor chip 130 are not separately bonded and instead, the unit block A is each bonded to the first substrate 110 or the second substrate 140.

Also, as described above, the at least one semiconductor chip 130 may be additionally and electrically connected to the first substrate 110, the second substrate 140, or the terminal leads 111*a* of the lead frame 111 by wire bonding or flip chip bonding. More specifically, a source area or a drain area of the semiconductor chip 130 is bonded to one side of the metal post 120 and if needed, a gate terminal of the semiconductor chip 130 may be electrically connected to the first substrate 110, the second substrate 140, or the terminal leads 111*a* of the lead frame 111 by wire bonding or flip chip bonding.

The metal post 120 may include a single conductive material or at least two conductive materials.

For example, the conductive materials of the metal post 120 may include at least any one of Cu, Mo, Mn, Al, Si, and C.

A surface pad metal of the semiconductor chip 130 may include 80% or more of Al, Ag, or Au.

Also, a silicon control rectifier (SCR), a power transistor, an insulated gate bipolar transistor (IGBT), a metal-oxide semiconductor field effect transistor (MOSFET), a power rectifier, a power regulator, or a power semiconductor including a combination thereof may be applied as the semiconductor chip 130 and may be used in electric vehicles, hydrogen electric vehicles, inverters, or converters.

The metal post 120 and the semiconductor chip 130 are bonded to each other by a soldering process using a solder containing Sn or Pb, wherein the soldering process is performed within 15 seconds and thus, damage on the surface of the semiconductor chip 130 occurring due to a difference in thermal expansion coefficient between the metal post 120 and the semiconductor chip 130 may be minimized.

Here, materials included in the solder may be different from those of an alloy in an adhesive used to bond the semiconductor chip 130 to the first substrate 110 or the second substrate 140.

The metal post 120 and the semiconductor chip 130 are bonded to each other by a sintering process using an adhesive containing 60% or more of Cu or an adhesive containing 60% or more of Ag, wherein the adhesive may be provided as in a paste form or a film form.

The metal post 120 and the semiconductor chip 130 may be bonded to each other by using a laser.

The metal post 120 and the semiconductor chip 130 may be bonded to each other by directly contacting a heat block (not illustrated) to the metal post 120 or the semiconductor chip 130.

The metal post 120 and the semiconductor chip 130 may be bonded to each other by hot air and thereby, bonding without direct contacting may be available. Here, the hot air may have the temperature in the range of 50° C. through 450° C. and may contain a predetermined percentage of nitrogen or hydrogen.

Figure 6:
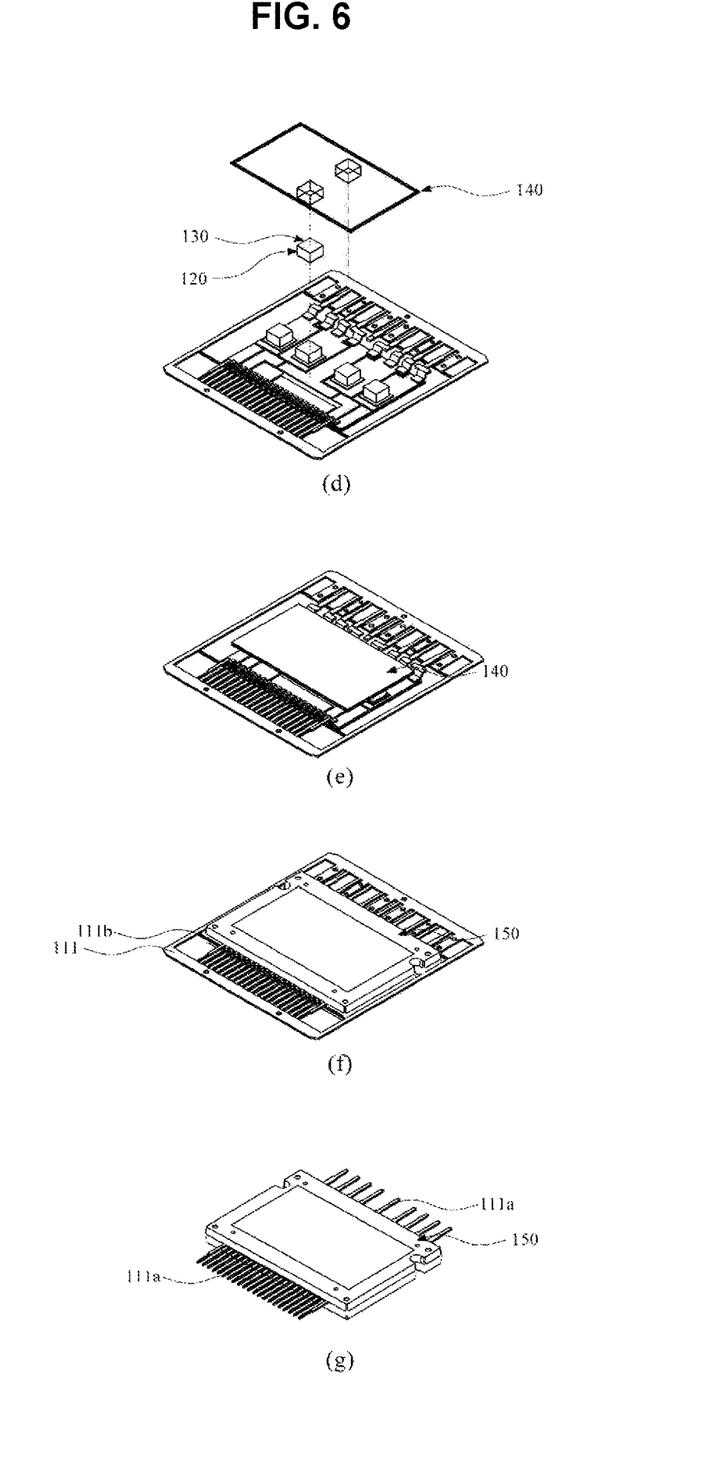

Then, as illustrated in FIG. 5(*c*), the at least one semiconductor chip 130 is bonded to the first substrate 110 and as illustrated in FIG. 6(*d*), the at least one semiconductor chip 130 is bonded to the second substrate 140.

Then, as illustrated in FIG. 6(*e*), the second substrate 140 is bonded to the other side of the metal post 120 combined to the first substrate 110, and the first substrate 110 is bonded to the other side of the metal post 120 combined to the second substrate 140.

That is, alternately, the second substrate 140 is bonded to the metal post 120 included in the unit block A previously formed of the metal post 120 and the semiconductor chip 130 both combined to the first substrate 110, and the first substrate 110 is bonded to the metal post 120 included in the unit block A previously formed of the metal post 120 and the semiconductor chip 130 both combined to the second substrate 140. Accordingly, the first substrate 110 and the second substrate 140 are supported to each other by the metal posts 120.

Here, as illustrated in an enlarged view of FIG. 7, the second substrate 140 may include at least one conductive layer 142 stacked on an upper part, a lower part, or both upper part and lower part of the insulating layer 141 formed of Al2O3 or AlN, or may include the conductive layer 142 as a single structure.

The processes of bonding the at least one semiconductor chip 30 to the first substrate 110 and bonding the at least one semiconductor chip 30 to the second substrate 140 may be performed using soldering or sintering. For example, the soldering may be performed using a solder containing Sn or Pb at the temperature in the range of 150° C. through 450° C. for predetermined time. Also, the sintering may be performed using an adhesive containing 60% or more of Cu or an adhesive containing 60% or more of Ag, wherein the adhesive may be provided as in a paste form or a film form.

Also, the processes of bonding the second substrate 140 to the other side of the metal post 120 combined to the first substrate 110 and bonding the first substrate 110 to the other side of the metal post 120 combined to the second substrate 140 may be performed using soldering or sintering. For example, the soldering may be performed using a solder containing Sn or Pb at the temperature in the range of 150° C. through 450° C. for predetermined time. Also, the sintering may be performed using an adhesive containing 60% or more of Cu or an adhesive containing 60% or more of Ag, wherein the adhesive may be provided as in a paste form or a film form.

Here, the process of bonding the at least one semiconductor chip 30 to the first substrate 110, and the processes of bonding the second substrate 140 to the other side of the metal post 120 combined to the first substrate 110 and bonding the first substrate 110 to the other side of the metal post 120 combined to the second substrate 140 may be sequentially performed or may be performed at the same time.

More specifically, the at least one semiconductor chip 130 is bonded to the first substrate 110 and the at least one semiconductor chip 130 is bonded to the second substrate 140. Accordingly, the at least one semiconductor chip 30 is fixed to the first substrate 110 and the at least one semiconductor chip 30 is fixed to the substrate 140. Then, the second substrate 140 may be bonded to the other side of the metal post 120 combined to the first substrate 110 and the first substrate 110 may be bonded to the other side of the metal post 120 combined to the second substrate 140, or the at least one semiconductor chip 130 is each placed on the first substrate 110 and the second substrate 140, and the second and the first substrates 140 and 110 are respectively placed on the other side of the metal post 120. Then, one bonding process (soldering or sintering) may be performed.

Then, as illustrated in FIG. 6(f), the first substrate 110 and the second substrate 140 are packaged using an EMC, PPS, or PBT to form the package housing 150 and the lead frame 111 is exposed.

Here, the first substrate 110 or the second substrate 140 may be partly or entirely exposed to the outside of the upper part or the lower part of the package housing 150.

Also, the terminal leads 111a are joined and electrically connected to the first substrate 110 or the second substrate 140 disposed inside the package housing 150 and may be bonded to the first substrate 110 or the second substrate 140 by ultrasonic welding.

Finally, as illustrated in FIG. 6(g), the dummies 111b of the lead frame 111 exposed to the outside of the package housing 150 are removed to form the terminal leads 111a.

As illustrated in FIG. 8(a), the heat sink 160 may be bonded to the first substrate 110 or the second substrate 140 both exposed to the outside of the upper part or the lower part of the package housing 150.

Also, as illustrated in FIG. 8(b), the heat sink 160 may be spaced apart from the package housing 150, installed inside the package housing 150, and bonded to the first substrate 110 or the second substrate 140.

For example, the heat sink 160 may be formed of a conductive substrate including 50% or more of metal components having excellent thermal conductivity, a conductive or non-conductive tape, or paste hardened and solidified at a high temperature of above 100° C. Then, the heat sink 160 is bonded to the first substrate 110 or the second substrate 140 and thereby, radiates heat from the semiconductor chips 130.

According to the method of manufacturing a semiconductor having a double-sided substrate described above, a semiconductor chip and a metal post are previously joined to each other and are respectively bonded to an upper substrate and a lower substrate, before the substrate and the semiconductor chip are joined to each other or the substrate and metal post are joined to each other. Accordingly, compared with separate bonding of the substrate, the semiconductor chip, and the metal post, damage occurring due to a difference in thermal expansion coefficient generated while bonding the semiconductor chip may be minimized so as to lower defect rate, and electrical properties and reliability of the semiconductor chip may be improved.

According to the present invention, a semiconductor chip and a metal post are previously joined to each other and are respectively bonded to an upper substrate and a lower substrate. Therefore, compared with separate bonding of the substrate, the semiconductor chip, and the metal post, damage occurring due to a difference in thermal expansion coefficient generated while bonding the semiconductor chip may be minimized so as to lower defect rate, and electrical properties and reliability of the semiconductor chip may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor having a double-sided substrate comprising:
   preparing a first substrate on which a specific pattern is formed to enable electrical connection;
   forming at least one unit block, each unit block comprising a semiconductor chip and a metal post bonded to the semiconductor chip, wherein a lower surface of the metal post is bonded to an upper surface of the semiconductor chip;
   bonding the at least one unit block to the first substrate, wherein a lower surface of the semiconductor chip is bonded to an upper surface of the first substrate;
   bonding the at least one unit block to a second substrate, wherein an upper surface of the metal post is bonded to a lower surface of the second substrate;
   forming a package housing by packaging the first substrate and the second substrate; and
   forming terminal leads toward the outside of the package housing to enable electrical connection.

2. The method of claim 1, further comprising additionally and electrically connecting the semiconductor chip to the first substrate, the second substrate, or the terminal leads by wire bonding or flip chip bonding.

3. The method of claim 1, wherein the first substrate or the second substrate comprises an insulating layer and at least one conductive layer stacked on an upper part, a lower part, or both upper part and lower part of the insulating layer.

4. The method of claim 1, wherein the first substrate or the second substrate is formed of a conductive layer.

5. The method of claim 1, wherein the metal post comprises a single conductive material or at least two conductive materials.

6. The method of claim 1, wherein the metal post and the semiconductor chip are bonded to each other by a soldering process using a solder containing Sn or Pb or by using a laser.

7. The method of claim 1, wherein the metal post and the semiconductor chip are bonded to each other by a sintering process using an adhesive containing 60% or more of Cu or an adhesive containing 60% or more of Ag.

8. The method of claim 1, wherein the metal post and the semiconductor chip are bonded to each other by directly contacting a heat block to the metal post or the semiconductor chip, or by using hot air which does not directly contact the metal post or the semiconductor chip.

9. The method of claim 1, wherein the first substrate or the second substrate is partly or entirely exposed to the outside of the upper part or the lower part of the package housing.

10. The method of claim 1, wherein the bonding the at least one unit block to the first substrate and the bonding the at least one unit block to the second substrate are sequentially performed or performed at the same time.

11. A method of manufacturing a semiconductor having a double-sided substrate comprising:

preparing a first substrate comprising a specific pattern formed thereon to enable electrical connection and a second substrate;

forming at least one first unit block, each first unit block comprising a first semiconductor chip and a first metal post bonded to the first semiconductor chip, wherein a lower surface of the first metal post is bonded to an upper surface of the first semiconductor chip;

forming at least one second unit block, each second unit block comprising a second semiconductor chip and a second metal post bonded to the second semiconductor chip, wherein an upper surface of the second metal post is bonded to a lower surface of the second semiconductor chip;

bonding the at least one first unit block to the first substrate and bonding the at least one second unit block to the second substrate, wherein a lower surface of the first semiconductor chip is bonded to an upper surface of the first substrate and an upper surface of the second semiconductor chip is bonded to a lower surface of the second substrate;

bonding the at least one first unit block to the second substrate and bonding the at least one second unit block to the first substrate, wherein an upper surface of the first metal post is bonded to the lower surface of the second substrate and the lower surface of the second metal post is bonded to the upper surface of the first substrate;

forming a package housing by packaging the first substrate and the second substrate; and forming terminal leads toward the outside of the package housing to enable electrical connection.

12. The method of claim 11, further comprising additionally and electrically connecting the first and second semiconductor chips to the first substrate, the second substrate, or the terminal leads by wire bonding or flip chip bonding.

13. The method of claim 11, wherein the first substrate or the second substrate comprises an insulating layer and at least one conductive layer stacked on an upper part, a lower part, or both upper part and lower part of the insulating layer.

14. The method of claim 11, wherein the first substrate or the second substrate is formed of a conductive layer.

15. The method of claim 11, wherein each of the first and second metal posts comprises a single conductive material or at least two conductive materials.

16. The method of claim 11, wherein the first and second metal posts and the first and second semiconductor chips are bonded to each other by a soldering process using a solder containing Sn or Pb or by using a laser.

17. The method of claim 11, wherein the first and second metal posts and the first and second semiconductor chips are bonded to each other by a sintering process using an adhesive containing 60% or more of Cu or an adhesive containing 60% or more of Ag.

18. The method of claim 11, wherein the first and second metal posts and the first and second semiconductor chips are bonded to each other by directly contacting a heat block to the first and second metal posts or the first and second semiconductor chips, or by using hot air which does not directly contact the first and second metal posts or the first and second semiconductor chips.

19. The method of claim 11, wherein the first substrate or the second substrate is partly or entirely exposed to the outside of the upper part or the lower part of the package housing.

20. The method of claim 11, wherein the bonding the at least one first unit block to the first substrate and the bonding the at least one first unit block to the second substrate are sequentially performed or performed at the same time.

21. The method of claim 11, wherein the bonding the at least one second unit block to the second substrate and the boding the at least one second unit block to the first substrate are sequentially performed or performed at the same time.

* * * * *